United States Patent
Kuznicki et al.

(10) Patent No.: US 10,886,422 B2
(45) Date of Patent: Jan. 5, 2021

(54) GROUPED NANOSTRUCTURED UNITS SYSTEM FORMING A METAMATERIAL

(71) Applicant: SEGTON ADVANCED TECHNOLOGY, Versailles (FR)

(72) Inventors: Zbigniew Kuznicki, Hoenheim (FR); Patrick Meyrueis, Strasbourg (FR)

(73) Assignee: SEGTON ADVANCED TECHNOLOGY, Versailles (FR)

( * ) Notice: Subject to any disclaimer, the term of this patent is extended or adjusted under 35 U.S.C. 154(b) by 93 days.

(21) Appl. No.: 14/890,606

(22) PCT Filed: May 13, 2014

(86) PCT No.: PCT/IB2014/002019
§ 371 (c)(1),
(2) Date: Nov. 12, 2015

(87) PCT Pub. No.: WO2014/203081
PCT Pub. Date: Dec. 24, 2014

(65) Prior Publication Data
US 2016/0118517 A1    Apr. 28, 2016

Related U.S. Application Data

(60) Provisional application No. 61/855,342, filed on May 14, 2013.

(51) Int. Cl.
*H01L 31/0352* (2006.01)
*H01L 31/068* (2012.01)
(Continued)

(52) U.S. Cl.
CPC ...... *H01L 31/035254* (2013.01); *G02B 1/002* (2013.01); *H01L 31/0288* (2013.01);
(Continued)

(58) Field of Classification Search
CPC ..... H01L 31/035236; H01L 31/035246; H01L 31/035263; H01L 31/03845; H01L 31/186–31/1872
See application file for complete search history.

(56) References Cited

U.S. PATENT DOCUMENTS 7,485,544 B2 * 2/2009 Forbes .............. H01L 21/26506
                                                      438/427
9,520,515 B2   12/2016 Kuznicki et al.
(Continued)

FOREIGN PATENT DOCUMENTS

CN    101777592 A    7/2010
TW    201128787 A    8/2011
(Continued)

OTHER PUBLICATIONS

Chinese Office Action dated Nov. 15, 2016 with Search Report in counterpart CN application No. 201480028253.8; with English machine-translation (total 10 pages) (D1, US20110162700 and D4, WO2012131496 cited in the Search Report of the CN Office Action are not listed in this IDS since D1 was already cited in the Office Action dated Aug 23, 2017 and D2 was already listed in the IDS filed Nov. 12, 2015).

*Primary Examiner* — Eric R Smith
(74) *Attorney, Agent, or Firm* — Seckel IP, PLLC

(57) ABSTRACT

This invention concerns a grouped nanostructured unit system forming a metamaterial within the silicon and the manufacturing process to arrange them therein in an optimal manner. The nanostructured units are grouped and conditioned in an optimal arrangement inside the silicon material. The process comprises the modification of the elementary crystal unit together with the stress field, the electric field and a heavy impurity doping in order to form a superlattice of nanostructured units grouped in an optimal arrangement so as to improve the efficiency of the light-to-electricity (Continued)

conversion by means of efficient use of the kinetic energy of hot electrons and efficient collection of all electrons generated within the converter.

12 Claims, 8 Drawing Sheets

(51) Int. Cl.
    *H01L 31/18* (2006.01)
    *H01L 31/20* (2006.01)
    *H01L 31/036* (2006.01)
    *H01L 31/0288* (2006.01)
    *G02B 1/00* (2006.01)
    *H01L 31/0216* (2014.01)
    *H01L 31/0376* (2006.01)

(52) U.S. Cl.
    CPC .. *H01L 31/02167* (2013.01); *H01L 31/02168* (2013.01); *H01L 31/036* (2013.01); *H01L 31/0352* (2013.01); *H01L 31/03762* (2013.01); *H01L 31/035236* (2013.01); *H01L 31/068* (2013.01); *H01L 31/1804* (2013.01); *H01L 31/202* (2013.01); *Y02E 10/547* (2013.01); *Y02P 70/50* (2015.11)

(56) References Cited

U.S. PATENT DOCUMENTS

| | | |
|---|---|---|
| 9,711,674 B2 | 7/2017 | Kuznicki et al. |
| 9,722,121 B2 | 8/2017 | Kuznicki et al. |
| 2009/0227061 A1* | 9/2009 | Bateman ......... H01L 31/022433 438/57 |
| 2011/0162700 A1* | 7/2011 | Kuznicki .............. H01L 31/068 136/255 |
| 2011/0197950 A1 | 8/2011 | Lin et al. |

FOREIGN PATENT DOCUMENTS

| | | |
|---|---|---|
| WO | WO 2010/089624 | 8/2010 |
| WO | WO 2012/131496 | 10/2012 |

* cited by examiner

FIG. 13
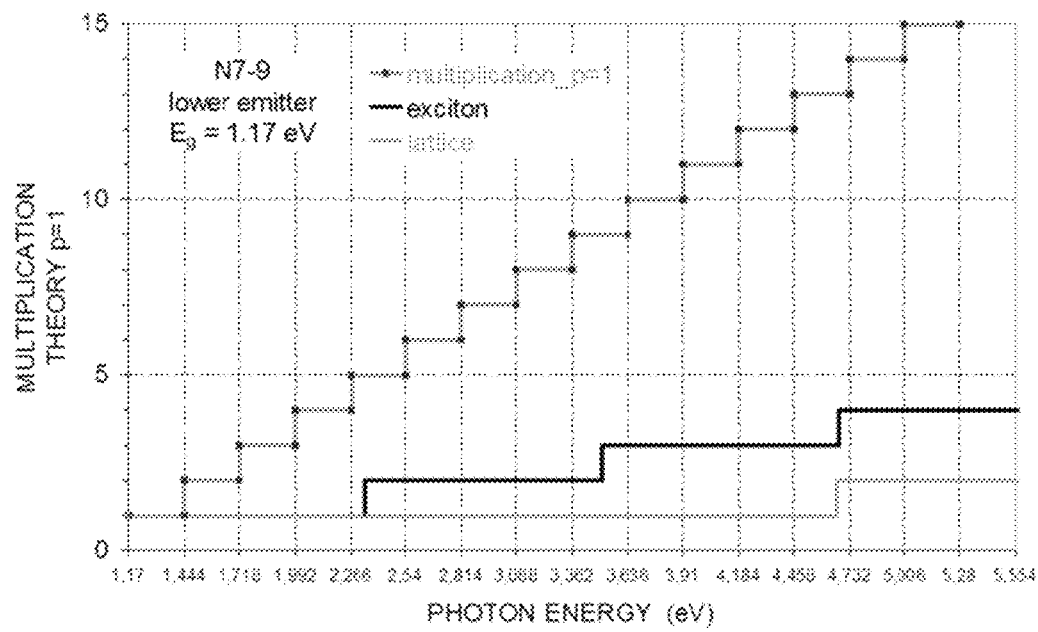
FIG. 14
FIG. 15
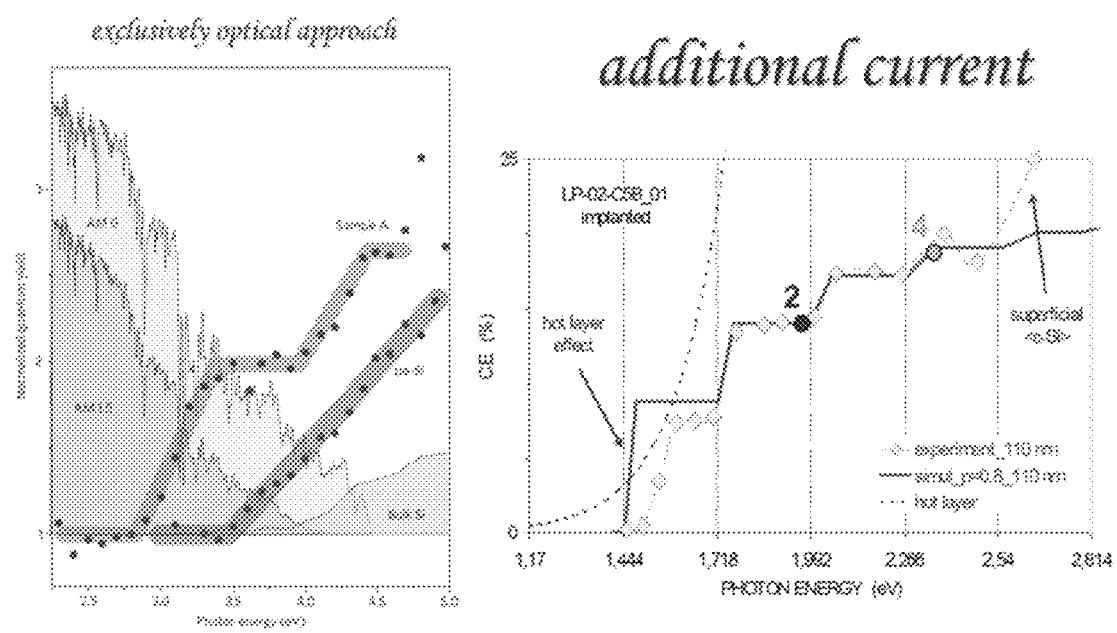

Example of a process step by step

| # | operation | description |
|---|---|---|
| 1 | c-Si | crystalline silicon wafer |
| 2a | c-Si (p-type) | homogeneous – light or moderate – p-type doping |
| 2b | c-Si (p-type) | rear p-type doping creating a BSF |
| 3 | c-Si (n-type) / c-Si (p-type) | heavy nonlinear n-type doping by diffusion from a surface source; creation of a generator internal membrane as PN junction |
| 4 | c-Si (n-type) / c-Si (p-type) | surface conditioning before implantation sequence |
| 5 | a*-Si (n-type) / c-Si (p-type) | amorphizing ion beam implantation through a mask that creates a buried substructure (a*-Si) |
| 6 | a**-Si (n-type) / c-Si (p-type) | solid-state epitaxy resulting from an annealing cycle (a**-Si) |

FIG. 16A

| 7 |  | segton conditioning within the seg-matter |
|---|---|---|
| 8 |  | electronic passivation; metallization; light trapping |

GROUPED NANOSTRUCTURED UNITS SYSTEM FORMING A METAMATERIAL

This invention relates to a nanoscale system formed of nanostructured units grouped and conditioned in an arrangement inside a silicon material as well as the manufacturing process to perform it inside this silicon material to be used especially in all-silicon light-to-electricity converters.

This process induces modification of the crystalline field i.e., the elementary crystal unit together with stress field, electric field, heavy impurity doping. The material modulation allows an efficient free-electron extraction, specific electron transport, useful defect screening and adapted geometrical factors.

More particularly the process is a nanoscale formation of a superlattice of nanostructured units grouped in an optimal arrangement to form a nanosystem in order to improve the efficiency of the light-to-electricity conversion by means of hot electrons and to allow an efficient collection of all electrons, primary and secondary, generated within the converter.

1 FIELD OF THE INVENTION

The adjustment of the light-to-electricity converter to the solar spectrum is complicated by on the one hand, the quantum mechanical operation being efficient or optimal in a very narrow spectral sub-range and on the other hand, by the wide spread of the solar spectrum which is too large for efficient operation using a single junction device.

Two ways are possible:
- by conserving the same fundamental single mechanism of the photon-electron interaction, exploited in the most efficiently tandem cells made of material research, GaAs family, etc. . . . and single light-matter interaction through absorption leading to a complicated current collection
- by introducing multiple additional mechanisms such as, for example, low-energy secondary generation with its several coupled mechanisms allowing the specific functional separation such as material transformations, electron transport, . . . and specific carrier collection.

This invention relates to a method for improving the secondary low-energy generation and multiplication of collectable additional carriers in the light-to-electricity converter in general and particularly in the all-silicon converters of the solar radiation due to sub-regions, sub-systems or substructures as, for example, a buried nanoscale layered system containing silicon metamaterial, called seg-matter all over the hereunder description.

Low-energy electron generation known as LEEG, is a process whereby multiple electrons are produced upon absorption of a single photon in semiconductor nano objects.

The LEEG is the first so promising mechanism within indirect-gap semiconductor as proved for silicon allowing an optimized adaptation of the semiconductor converter to the solar spectrum. The invention is of particular importance because silicon largely dominates the photovoltaic industry, and presents no problems regarding abundance and accessibility within the Earth's crust, and poses no significant environmental problems regarding toxicity and recycling. The last development of crystalline silicon devices, representing in a someway a return to the first photovoltaic generation, is an excellent base for such improvements being covered by the invention.

2. DEFINITIONS

LEEG—Low-Energy Electron Generation is a process whereby multiple electrons are produced upon absorption of a single photon in semiconductor nano objects. The effect represents a promising route to increase efficiency of solar light conversion in single-junction devices.

Segton—is a unit of the Secondary Electron Generation Tuned on Nanoscale, i.e., conditioned elemental unit cell of matter characterized by its specific and highly useful set of electron energy levels that is adapted for an efficient multistage light-to-electricity conversion. The system allows a low-energy electron photogeneration of additional free-carriers and a carrier multiplication cycle. More generally it is also a method of, how to produce the highly useful set of electron energy levels that can be optimized for the solar spectrum conversion to electricity. and further each segton is a semiconductor nano object having a specific set of electron energy levels that is able to complete the electron energy levels of natural semiconductor materials, preferentially silicon, useful for ultra-high efficiency light-to-electricity converters. Segton is constituted on the basis of the divacancy being quasi-permanently in a doubly negative charge state and is conditioned by its physical neighborhood.

Seg-matter—is a segton based metamaterial, i.e., the specific material for an efficient light-to-electricity conversion that is constituted of homogeneously distributed segtons that form an ordered superlattice and are plunged in a specific physical environment bordered by nanomembranes. More generally, this expression means also the method of how to produce the matter being able to exploit the set of segton energy levels. And further seg-matter is the semiconductor artificial matter forming a metamaterial, which allows segton conditioning and assumes multi-faceted functionality, which is principally available at the nanoscale.

MTM: silicon based metamaterial
a-Si: amorphized silicon phase
<a-Si>: amorphized silicon phase under strain
c-Si: crystalline silicon phase
<c-Si>: crystalline silicon phase under strain
Divacancy: structural point defect that forms a specific structural unit in a semiconductor, where different atom bonds, like molecular bonds, appear in a covalent material.
BSF: back surface field
BSF interface: LH type semiconductor junction resulting from the abrupt or gradual change of the doping impurity density.

3. BACKGROUND OF THE INVENTION

Today's the photovoltaic effect is obtained and based on single-junction and multi-junction planar semiconductor devices. This simple architecture exploits natural materials which may be optionally slightly modified. The photon interaction with the matter relies on two principles: all or nothing and one photon one electron-hole pair.

This view of things can be enriched by dedicated converter sub-regions, sub-systems, substructures, i.e., artificial nanoscale components that should be able to complement the conventional conversion by new mechanisms.

Specific nanoscale components nano objects called "segtons" are necessary but largely insufficient to assume the full conversion process that requires a chain of several sequential interactions, following one after another, and, what is particularly important, practically all of them in a very short-time scale.

This can be assumed by an artificially modulated material called hereby "seg-matter" formed between others, from well-defined building blocks of a well-determined density that is located in the well-determined volume of the converter. To ensure the full conversion functionality of the seg-matter one needs to fulfill a number of strict conditions. The seg-matter has to be able to interact efficiently with its neighboring silicon sub-systems through its limiting membranes.

Individual segtons are formed around two empty atom sites known as vacancies that are at the origin of new prolonged atom bonds resulting from transformed dangling bonds, leading to a specific point defect called divacancy.

But, the individual divacancy as it represents a harmful defect appearing after an irradiation of the semiconductor material by cosmic rays, γ rays, X rays, electron beam, ion implantation, etc. . . . the seg-matter requires a minimal density of segtons and can result only from a specific manufacturing process being able to produce massively segtons in the well-defined sub-space of the converter. The dense enough population of divacancies that are grouped in a well-determined and limited space can be produced only by specific techniques allowing a necessary deposition and focalization of the energy on the atom scale to empty simultaneously a large number of lattice sites.

An example of such a manufacturing process is described in detail on the basis of the ion implantation and subsequent thermal treatment. The metamaterial nanolayer is shaped and persists at unusually high processing temperatures about 450-550° C. and 250-450° C. due to a built-in local stress or strain. Divacancies are known as to recombine at temperatures lower than 250° C.

To assume its function, the metamaterial nanolayer is plunged in a heavily n-type doped material, preferentially crystalline silicon, c-Si, and is shaped by two delimiting interfaced membranes.

On the one side in silicon derived material there is a c-Si/<c-Si> edge that is determined by a built-in mechanical field of <c-Si>/a-Si interface due to a dilatation effect. On the other side there is a <c-Si>/a-Si edge resulting from the amorphization and a suitable thermo dynamical cycle. Both limits play a role of nanomembranes that are able to control mechanisms of electron transport. Due to its segtons, the metamaterial nanolayer provides extrinsic energy levels tuned for low-energy electron generation and multiplication. Due to both the specific set of energy levels and the built-in electric field, the electron conduction across the metamaterial nanolayer is of unipolar nature concerning exclusively electrons which form an electron current. The thickness of the metamaterial nanolayer (<c-Si> nanolayer) is determined by the built-in strain and local mechanical field from a dilatation between a-Si and c-Si induced by or resulting from the recrystallization cycle by solid phase epitaxy. Experiments by X-ray and LEED show that on the crystalline side, well visualized by available techniques, this thickness is of the order of 5-10 nm.

As the result the main seg-matter features concern:
profound local transformations of semiconductor, preferentially c-Si possible at the nanoscale and leading to a metamaterial, preferably Si-metamaterial, called seg-matter,
uniform stabilized composition of seg-matter nanolayer(s),
enough quantity of whole seg-mater metamaterial corresponding to the intensity of incident photon flux,
adapted space position of the seg-matter system that has to be close to the absorption place of energetic photons as a local optimization:
proximity and/or unity of absorption and secondary generation places,
maximal or optimized exposition surface in shape and arrangement for fast collisional interaction with hot electrons,
maximal or optimized in time interaction with hot electrons which are electrons with large kinetic energy resulting from absorption of energetic photons to avoid their previous partial thermalization; the fastest possible interaction time scale,
avoiding of any aging effect induced by segton transformation or recombination that is assumed by the stabilizing built-in strain and the low optimized temperature of the converter working point,
rapid electrical regeneration and charging and discharging due to a multistage dynamics of conduction mechanisms around and inside the metamaterial,
specific conduction mechanism allowing the fast enough segton recharging and regenerating by electrons arriving from the lower parts of the converters,
unipolar conduction inside the metamaterial nanolayer assumed exclusively by electrons,
fast electron extraction via conduction band and replacing electron injection via impurity band,
unidirectional local conduction of kick out and extracted electrons and of injected electrons that recharge and regenerate segtons; that unidirectionality excludes recapture of kick out equilibrium electrons and allows extraction of secondary electrons, Only, in this complete way the desired multiplication cycle can be realized due to nano objects called "segtons", i.e. the unit of the secondary electron generation tuned on nanoscale. The useful electron dynamics: electron extraction and segton recharging can be only assumed through the nanomembranes that delimit the seg-matter.

The electron multiplication cycle by hot electrons requires well-adjusted density or effective cross section of segtons. Such a cross section can be scaled within the metamaterial nanolayer.

The best imaginable light-to-electricity converters have to be built from silicon which is abundant, technologically best matured and environmentally friendly cunningly transformed on the nanoscale. It is particularly important that the silicon can be provided with a set of suitable energy levels due to substructures containing segtons.

This remains the analogy with silicon nanocrystals that may provide the converter with a set of suitable energy levels. In this way, the single primary electron-hole generation due to absorption of energetic photon can be transformed into multiexciton multiplication generation: the effect that can lead further to a free carrier multiplication.

Two types of silicon modifications then appear when shaping in silicon nanocrystals:
i) quantum mechanical related to the size of nanocrystals and
ii) specific energy states located at the nanocrystal interface.

The system can be very well adjusted optically. The critical problem of conversion with silicon nanocrystals concerns the free carrier: multiplication, extraction and collection.

The specific set of energy levels of the c-Si i.e., energy band system and of the silicon segton i.e., extrinsic energy levels within the band gap, allows an optimized conversion of the solar spectrum. The collisional liberalization of weakly bonded electrons by hot electrons is well adjusted for an optimized conversion of the solar spectrum. Moreover, the electric charge of segtons is a controllable parameter, rendering the electric structure adjustable, possibly resulting in novel tunable electronic, optical and electron transport properties to become useful in practical applications.

4. SHORT DESCRIPTION

The superlattice called seg-matter is an optimal arrangement of segtons in the form of one or two or multiple superposed layers. Segtons are advantageously coupled to their physical surrounding that is strictly physically conditioned and are usefully placed within the converter from the viewpoint of the incident light radiation and absorption.

The new material according to this invention is organized from building blocks ordered in a superlattice. In this way, the density, distribution, position and behavior of nano objects based on divacancies can lead to technically useful applications by fulfilling the desired, normally unachievable, functionality. Two of the most specific features of the used segtons concern their near permanent electric charge-state, i.e., the fast regeneration of the charge-state.

Segtons are arranged to form an ordered-like superlattice which is a regular network of the aforementioned metamaterial elementary units that has to be shaped, for example, in a nanolayer, preferentially within the crystalline silicon. This nanolayer has to be conditioned and homogenized during the processing steps leading to the inventive device. It means that it has to be preserved in all encountered thermal conditions, i.e., processing temperatures reaching 550° C., whereas normally divacancies recombine at temperatures lower than 250° C.

To be useful in the efficient light-to-electricity conversion the electron dynamics in the seg-matter is extremely fast. Extremely short time constants of segton charging and discharging are of the order of picoseconds. Such an operation requires a specific n-type semiconductor environment, e.g., due to P-doping, and specific electron transport. For example, such a transport may result from the unipolar conduction hopping of, e.g., the P-doping impurity band occurring in the upper half of the indirect band gap of silicon.

The photon-electron, electron-electron interactions and electron transport dynamics of segton necessitate a dedicated specific nanospace or volume of the converter dedicated for seg-matter. This nanospace has to be well-delimited by nanomembranes allowing its full cooperation with neighboring zones, i.e., combining the specific set of electron energy levels with an excellent electron conduction/transport. The ability of extraction and collection of electrons from seg-matter predestinates its technical applications.

The inclusion of segtons inside a layer of monocrystalline silicon, wafer, or thin layer induces an increase of the efficiency of the photovoltaic effect in transforming the multispectral light into electricity. This effect is operational by a specific layer arrangement of segtons inside the silicon. A nanostructure is produced and organized by a dedicated method using and grouping segtons as and three dimensional building blocks operating jointly at two levels: an atomic interaction level and a nanoscale organizational level. The resulting geometrical organization of silicon constitutes a silicon metamaterial named seg-matter that is buried into a crystalline silicon emitter.

Segtons and seg-matter can be produced at low cost by using commercially available production equipment dedicated initially to micro electronics but used in a specific way. The transformation of silicon into silicon segtons and seg-matter introduces no more ecological footprints for manufacturing and recycling than silicon material. The risk for health existing for carbon nanotubes for device fabrication are void for silicon segtons and seg-matter as they are physically "glued" to each other. If they are melting or melted, they will turn back to silicon material without any trouble-causing dispersion of particles.

This invention concerns the generation similar to multi-exciton generation due to the absorption of energetic photons by segtons that leads to free-carrier multiplications.

This invention concerns the multiexciton generation due to the absorption of energetic photon by segtons that leads to carriers multiplications.

The electric charge of segton can be controlled provided to an adjustable possibility of electron transport properties.

5. REQUIREMENTS

At the first level the seg-matter has to be conditioned during a suitable specific technological processing assuming, by the way, an optimized distribution and density of segtons. A new material can then be organized from building blocks ordered in a superlattice. An artificial component of new material combines advantageously useful effects and processing to fulfill the desired, normally unachievable, functionality. Two of the most specific features of said segtons that have to be imperatively assumed within the seg-matter, i.e., the segton electric charge-state and its fast regeneration rate. The charge-state must to allow a new and unique conversion mechanism, i.e. the neverending low-energy generation, to fully function.

At a second level, and still in accordance with the invention, seg-matter has to be shaped, for example, in a nanolayer, preferentially within the crystalline silicon. This nanolayer has to be conditioned and homogenized during the processing steps leading to the inventive device. It means that it has to be preserved in all encountered thermal conditions, i.e., processing temperatures reaching 550° C., whereas normally divacancies recombine at temperatures lower than 250° C.

As a result, a network of segtons is then spread uniformly within at least one seg-matter nanolayer in the converter allowing the required functionality as is the optimal probability of the collisional electron generation to convert the maximal part of the additional kinetic energy of hot electrons into an additional near-equilibrium electron population. These new mechanisms of the energy-to-population conversion of large practical, technological and economic interest have to be exploited on dedicated devices.

Considered at the third level, the disclosed and claimed invention also teaches the person skilled in the art that to be useful in the light-to-electricity conversion; the segton nanolayer has to have a determined useful shape and has to be located in a region assuming an optimal interaction with hot electrons resulting from the primary generation. To avoid the harmful thermalization of hot electrons i.e. the heating of the silicon lattice, the interaction has to be controlled in the temporal and geometrical scales.

6. MANUFACTURE

The manufacture processing should make it possible to locate segtons in well-defined converter space that has to appear closely enough to the absorption zone, especially closely to the absorption zone of energetic photons. Because of a spectral distribution of the incident light beam, the absorption space depends on the photon energy: the higher the energy, the lower the photon penetration depth. The manufacture processing should make it possible to tune the position as to depth, dimension, and thickness occupied by segtons to the absorption space.

The method to create and manufacture the nanoscale unit according to this invention will now be shortly described with general terms and expressions in the following section.

The fabrication or manufacture and conditioning of segtons has to allow simultaneously the required functionalities:
i) the creation of specific nano objects in type, electric charge state, density, location and position in geometrical space, etc. . . . resulting from a reorganization of atoms in the crystalline lattice or amorphous and amorphized phase,
ii) the insertion of a suitable set of electron energy levels that enables the low-energy generation of secondary electrons,
iii) in reality, specific functionality resulting from the synergy of several physical interactions that are involved in more efficient photoconversion can be activated, sometimes exclusively on the nanoscale
iv) the generation and recombination places of secondary electrons are suitable separated or screened from each other and the recombination-extraction of free electrons takes place rather practically entirely at the front face electrode.

In general, the required functionality results from two types of effects: those which are intimately related to the matter structure nano objets and segtons themselves and those which are related to physical fields triggered at the nanoscale, for example, imposed by the neighborhood of semiconductor interfaces with their transition zones.

7. BENEFICES AND ADVANTAGES OF THE INVENTION

Seg-matter allows new light-to-electricity conversion mechanisms, preferentially in silicon devices. The specific set of extrinsic energy levels that segtons provide the silicon host material, plays a fundamental role or function in an important efficiency enhancement mainly due to the low-energy secondary generation and multiplication cycle. In this way, additional electrons can be generated per energetic photon in the electron multiplication cycle. All-silicon light-to-electricity converters with ultra-high efficiency are then possible because of the superposition of adjusted silicon derived materials. The silicon converter contains energy levels and bands arranged for optimal conversion processing of the solar spectrum. The invented processing is based on the best matured silicon technology and require only modifications and complements of existing production facilities.

The original energy bands of the silicon that are less adapted to the conversion of solar spectrum can be adjusted advantageously by a complementary set of energy levels from segtons that is especially optimized for the conversion of visible and UV photons.

The converter with seg-matter operates due to two types of carrier generation: the primary single electron-hole conventional generation and the new secondary electron generation. In other words, the simple primary generation of the electron-hole pair resulting from photon absorption is transformed into a multistage conversion cycle. The secondary generation allows avoiding the harmful thermalization of hot electrons, i.e. the heating of the silicon lattice. Due to adjusted converter architecture the hot electron interaction can be controlled in the temporal and geometrical scales.

The device manufacture with all nano transformations, converter functioning and its final destruction are totally devoid of processing steps with free nano particles that can be dangerous for environment and human being.

The manufacture can be assumed by well experienced industry operators such as engineers and technicians. One of the most important new fabrication processing concerns the ion implantation and subsequent thermal treatment.

8. THE GOALS OF THE INVENTION

The conversion of the additional electron energy resulting from absorption of energetic photons, today lost on the thermalization, into an additional electron population that is collectable in the external circuit. The improvement is possible due to units for secondary electron generation tuned on nanoscale called segtons. To be technically useful, segtons have to fulfill several conditions such as to be sufficiently numerous and well distributed, placed in a well-defined nanospace, permanently conserve their useful charge state.

The weakly bonded electrons of segtons can be liberated due to a collision of electrons having large enough kinetic energy, which are hot or warm electrons with segtons. The hot or warm electrons can result from light irradiation, electric field acceleration or other effect as carrier injection. All this leads to the improvements, non exhaustively mentioned, as follows:
new high efficient light-to-electricity converters with the thermodynamic limit of about 63%,
new devices manufactured from an abundant, ecologically friendly material processed with a mature technology,
new conversion mechanisms complementing conventional operation mode due to their low-energy nature,
new electron energy system allowing the converter adjustment to the solar spectrum,
new manufacture processing leading to a new conversion materials and structures complementing the basic material and device architecture,

9. BRIEF DESCRIPTION OF THE DRAWINGS

Figure 9:
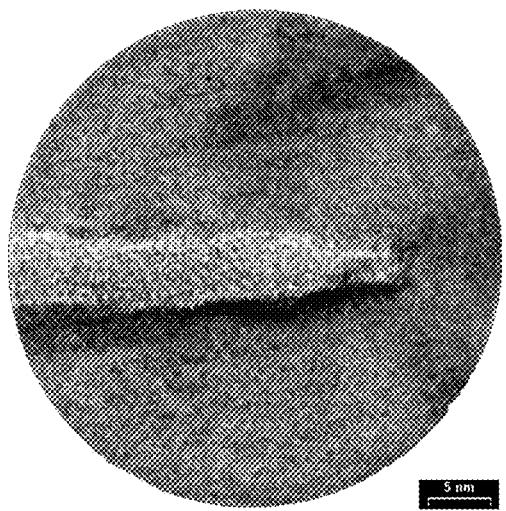
FIGS. 9 and 10 are two X-TEM images of two different geometries of amorphized nanostructures buried within the crystalline Si.

FIG. 9 an image with discontinuous amorphization and

Figure 10:
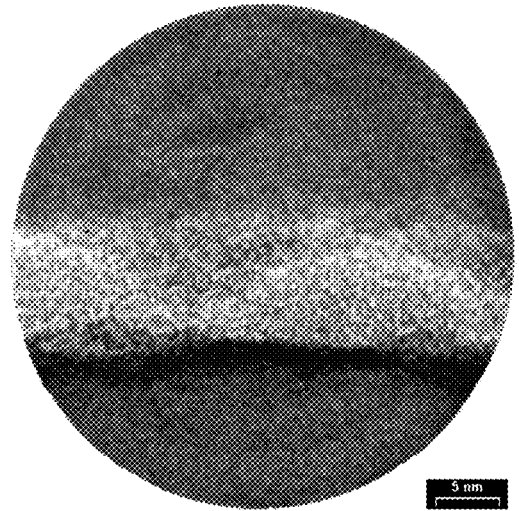
Figure 11:
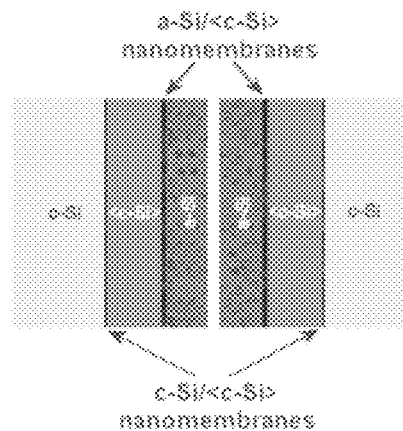
Figure 12:
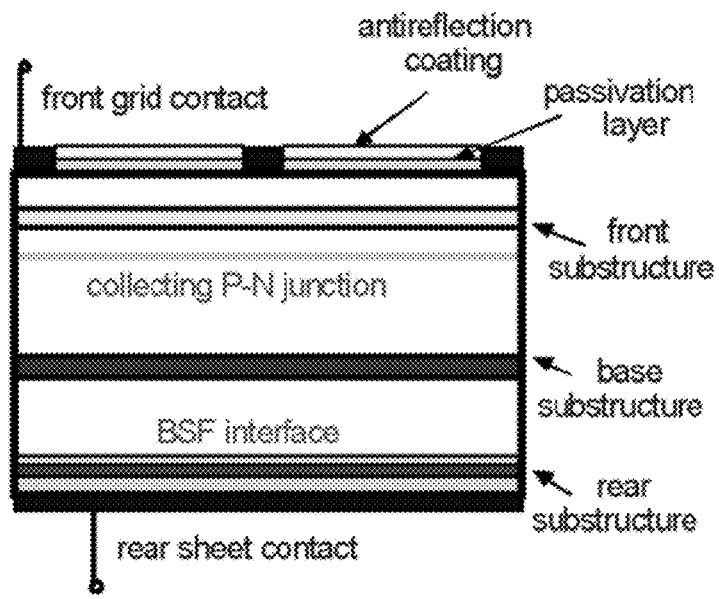
Figure 16B:
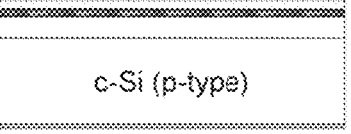
Figure 16B:
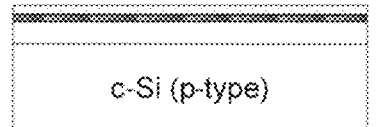

FIG. 10 an image with amorphized layer with local circular valley system;

FIG. 11 is a schematic representation of an example of a nanomembrane system. Drawing not to scale;

FIG. 12 is a cross section view of possible insertion places of the seg-matter nanolayers;

FIG. 13 is a multigraph image for the comparison of stair-like theoretical orders of electron multiplication;

FIG. 14 is a multigraph image for the comparison of the photovoltaic impact of the seg-matter;

FIG. 15 is a curve which illustrates the additional current from photon energy;

FIG. 16A is an organigram of the different steps of a process to create seg-matter nanolayers; and FIG. 16B is a continuation of FIG. 16A.

10. THE INVENTION AND ITS MANUFACTURING PROCESS

The description of the parallel protection bearing on elementary units called segtons is incorporated herewith for useful further explanation if needed and by way of reference.

To become useful in the light-to-electricity conversion the silicon must undergo a complex transformation, which will lead to the harmful, randomly and sparsely distributed structural defects onto the elementary units called segtons of the ordered superlattice that forms a metamaterial called seg-matter. The most important aspect concerns the nature, the density and the number of defect points or divacancies being well positioned in the converter space.

The preferred method of seg-matter manufacture is based on reservoirs of divacancies that are amorphized insertions within the emitter. These reservoirs realize divacancies into a nanolayer wrapping around each amorphization during suitable processing. The nanolayer grafted with divacancies and immersed in various physical fields present at the a-Si/c-Si heterointerface is transformed into a metamaterial called the seg-matter for secondary electron generation matter.

Seg-matter results from a local conditioning of the semiconductor crystal lattice by intense physical fields working together, such as stress fields, electric fields, and heaving impurity doping, whereby ordered structural defects are able to form a metamaterial nanolayer.

This nanoscale transformation may be realized close or around a crystalline or amorphous hereointerface, preferentially a-Si/c-Si heterointerface, due to a suitable thermodynamic treatment.

By the analogy, the arrangement of seg-matter within the host material c-Si can be compared to the location of silicon nanocrystals within the dielectric. In both cases a set of electron energy levels is artificially tuned to efficient interaction with the solar spectrum.

Seg-matter has to be placed preferentially within the emitter nearby to the front face of the converter in close connection with converted light wavelength. A method of nanoscale transformation being able to fulfill several required conditions is based on a local amorphization of a previously crystalline semiconductor using an ion beam and a thermodynamic processing. This processing allows a good self-organization in an ordered superlattice due to the built-in strain field that is induced by dilatation forces at the c-Si/a-Si interface. There are, at least, two possible methods of implementation:

two step processing: previous n-type doping (phosphorous) that is next followed by an ion implantation up to local or buried amorphization (P, Si), single ion implantation up to local or buried amorphization using exclusively doping ions (P).

Both mentioned methods lead to locally heavily doped material and allow, by the consequence, a unipolar conduction involving simultaneously the impurity and the conduction bands. The choice depends on the fine adjustment to the converted spectrum.

In the first step, the amorphization produces buried insertions with rough or rugged a-Si/c-Si heterointerfaces and small a-Si inclusions in c-Si and c-Si inclusions in a-Si. The subsequent annealing cycle, preferentially at about 500-550° C. takes the form of a solid state epitaxy and leads to clear separation of both silicon phases, crystalline and amorphized, as well as to sharp planar a-Si/c-Si heterointerfaces. The same annealing cycle leads to the creation of more or less planar-parallel nanolayers that are smoothly wrapping around each amorphized insertion. The said nanolayers of 3-5-10 nm thick are uniform, without any faults and inequalities and contains numerous and ordered segtons forming together the seg-matter which is silicon based MTM.

One of the best techniques being able to assume numerous requirements concerning segton shaping is the transition of silicon phase around an amorphized-crystalline heterointerface, i.e., a controlled recrystallization of the previously amorphized crystalline material. The amorphized phase contains displaced atoms with a "memory" of their previous position in the crystalline network. By a suitable recrystallization in which the energy necessary to the transformation is relatively low, a part of displaced atoms stay at their new places while the phase becomes crystalline with numerous point defects. The recrystallized material has a dominant crystalline behavior but contains numerous displaced atoms that are distributed rather uniformly. The controlled recrystallization has to respect several conditions concerning the rate of recrystallization by solid state epitaxy, temperature, delay to conserve numerous displaced atoms in their new positions and to avoid additional harmful structural damages resulting, for example, from too violent atom movements.

This is the only one processing that is able to satisfy all the mentioned above requirements simultaneously, namely the ion implantation and a well-controlled, subsequent or real-time, thermal treatment. This processing allows a good localization of the transformed material from the absorption viewpoint.

The a-Si/c-Si heterointerface gathers numerous divacancies to the density of about $10^{20}$ cm$^{-3}$, which are trapped within the dilatation from tensile strain field. This tensile field plays, at least, four roles:

i) reduces divacancy recombination, ii) reduces divacancy mobility allowing their trapping in a well-defined volume space, iii) allows divacancy conservation at unusually high temperatures of 500-550° C. during the device manufacture processing and iv) orders divacancy distribution into a self-ordered superlattice network.

The same a-Si/c-Si heterointerface provides the seg-mater nanolayer in the well-directed built-in LH-like electric field, resulting from the transition from the lightly to the heavily doped zone, which extract just-liberated secondary electrons outside the seg-matter nanolayer.

The ion implantation and subsequent processing allows fulfillment of other requirements as the permanent double negative charge state, the spatial disposition, the electron transport etc. . . . . All these transformations lead to a metamaterial build from segtons. The segton double negative charge state allows a low-energy electron transition and/or release between the divacancy or segton energy level in the upper half of the indirect Si band gap and the conduction band. The local concentration of doping impurity, n-type semiconductor, has to be large enough to charge and recharge all numerous divacances. The technically useful double negative charge state has to be instantaneously renewable just after an electron emission or extraction. All mentioned above requirements transform the divacancy, which is a single physical object, into segton which is a divacancy with its suitable environment, i.e., technical object that furnishes suitable energy levels occupied by weakly bonded electrons.

In general, the fabrication or manufacture and conditioning of segtons and segmatter allow simultaneously:

Ion implantation allows a reorganization of atoms in the crystalline lattice and/or in the amorphous or amorphized phase; the structural transformation leading to a new material phase results from an accumulation of point defects concentrated or contained in a specific nanospace or nanolayer, for example, the density and the internal energy of the new phase is lower than of its crystalline counterpart being placed somewhere between crystalline and amorphized.

Doping profile, n-type and dense enough, may be obtained, for example, in two ways, by the diffusion of doping ions or by the suitable doping ion implantation. The specific high density of the doping profile concerns mainly the buried substructure and its near neighborhood.

Material modulation and structural transformations lead to a new phase of well-known "old" material, being useful in soft light-matter interactions. One can start, for example, from its crystalline phase by its local deep transformation leading to a specific "modulation" of atom positions in crystalline lattice. Such an atom scale processing, results, for example, in shifting some atom population from their equilibrium sites in the crystal unit cell into metastable sites that are usually unoccupied. The new metastable atom distribution has to concern a large enough atom density. The required processing has to allow a local energy deposition as, for example, the irradiation by a more or less focalized energy beam. The operation is able to shift a numerous atom population occupying a specific volume and assumes in this way a necessarily profound material modulation.

Example of material modulation leading to the creation of seg-matter by an ion irradiation being realized in several stages:
1) the initial n-type doping profile, e.g., phosphorous, by the so-called low-temperature thermal diffusion at T<1000° C. or another method such as a doping implantation in the homogeneously, lightly or moderately, p-doped wafer, e.g., pre-doped by boron,
2) pre conditioning of the wafer surface after the diffusion process to allow a good control of the implanted volume,
3) 10-200 keV ion beam irradiation leading to a buried amorphization, possible, for example, by two ways, by a self Si implantation or by P implantation,
4) constitution of excellent c-Si/a-Si heterointerfaces by the thermal annealing cycle, for example at 500° C.,
5) constitution of MTM nanolayers by the thermal annealing cycle, for example at 350-450° C.,
6) activation of segtons,
7) device final processing steps: AR coating, electronic passivation, metallizations.

Transformations:
phase transformation (ion implantation): crystalline→amorphized→crystalline with locally concentrated point defects, processed further into segtons,
c-Si/a-Si interface (ion implantation): creation→smoothing→seg-matter,
local homogenization of amorphized and crystalline phases (annealing cycle): dissolution of inclusions,
nanomembranes delimiting seg-matter: a-Si/c-Si→a-Si/<c-Si>—energy barrier, a high offset in the valence band and <c-Si>/a-Si—change of the electron transport mode,
conditioning or processing of segtons (annealing cycle): activation of heavy doping,

TABLE

| Basis of improved photoconversion | |
|---|---|
| Object | Operation |
| converter | main goal of the nanostructuration: incorporation of new efficient conversion mechanisms into conventional rather Si converters - an efficient low-energy secondary generation introduction of appropriate facilities into the device emitter (appropriate depth and fine structure design) design of substructute(s) for a low-energy secondary generation - mapping, architecture, superposition, . . . |
| amorphizing ion implantation | appropriate distribution of amorphized nanoobjects with suitable initial sizes: insertions/substructures providing the converter in fine in reservoirs of segtons and seg-matter appropriate processing - one beam or more beams, energies, doses, angle(s) of the incidence, species, the order, looking for interactions, conditions (for example, target temperature), shaping with respect of further processing (eventual superposition of successive treatments), balance of overall processing, previous and further processing steps, specific conditions |
| structure | the cycle(s) of thermal treatment has(ve): at first place, to figure the two neighboring areas on both sides of the c-Si/a-Si heterointerface to order their extreme mismatch just after the amorphization to dissolve or restructure inclusions of opposite phases (a-Si in c-Si and c-Si in a-Si) to release the crystalline <c-Si> phase stuffed with numerous point defects and to uniform the distribution of the crystalline <c-Si> phase that has surround homogeneously the amorphized objects to homogenize the distribution of segtons inside the crystalline <c-Si> phase (it can be denser close to the <a-Si>/<c-Si> interface and rarer close to the <c-Si>/c-Si interface to well-form, smooth and stabilize c-Si/a-Si interfaces to become uniform, aligned and stabilized due to the dilatation strain (especially on the c-Si side) |
| n-type doping | previously on or simultaneously with amorphization activation of the heavy n-type doping (better ionization rate due to ion implantation) |
| electric charge state | permanent doubly negative charge state even under light illumination extremely fast dynamics of segton recharging after a secondary generation |
| electron transport | free vertical transport through the emitter allowing an optimal carrier collection advantageous weighting between the transport mechanisms of conduction and impurity bands |
| characterization | optical: intermediate characterization (for example reflectivity) using testifying reference samples or dedicated wafer areas (without implantation masks or with dedicated scanned paths) electronic: I(V) curves |

11. EXPLANATION BY MEANS OF THE FIGURES

Hereunder is a brief description of the invention with the help of the appended figures.

Figure 1:
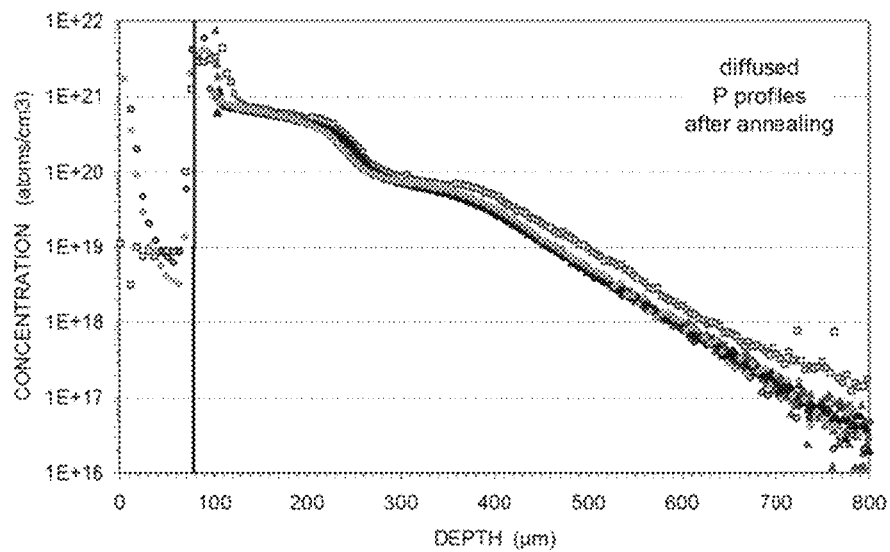
FIG. 1 is a graph which shows the comparison of phosphorous profiles ($^{31}P$) diffused at 850° C. and measured by SIMS.

FIG. 1 is a graph which shows the comparison of phosphorous profiles ($^{31}P$) diffused at 850° C. and measured by SIMS after ion-amorphization and related processing.

Figure 2:
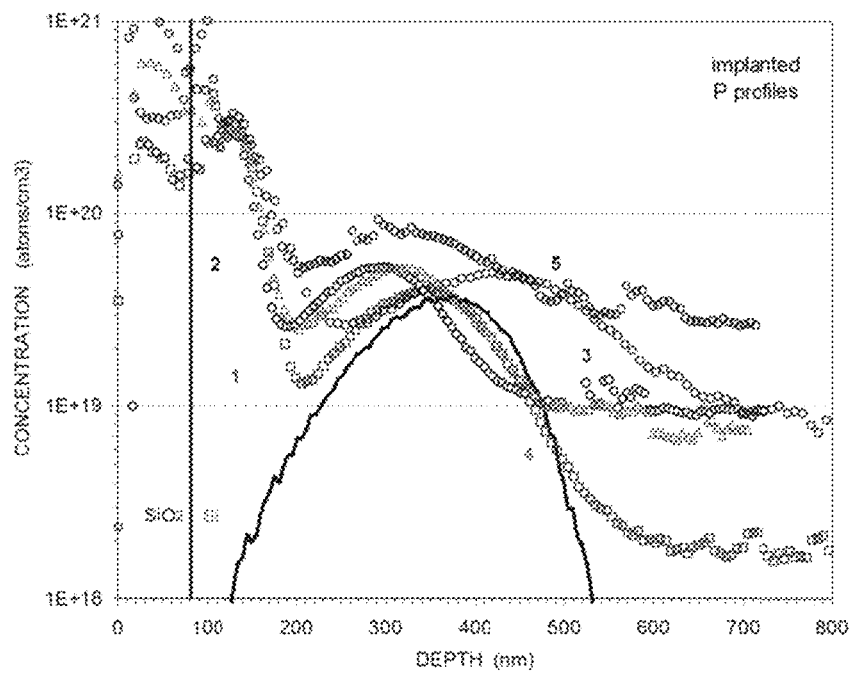
FIG. 2 is a graph which shows the comparison of doubly implanted phosphorous profiles ($^{31}P$), implantation energies.

FIG. 2 is a graph which shows the comparison of doubly implanted phosphorous profiles ($^{31}P$), implantation energies: 15 keV and from the range lying between 100-250 keV, measured by SIMS after ion-amorphization and related processing. The continuous line shows the implanted phosphorous profile ($^{31}P$) resulting from the Monte-Carlo simulation SRIM code for 180 keV implantation energy.

Figure 3:
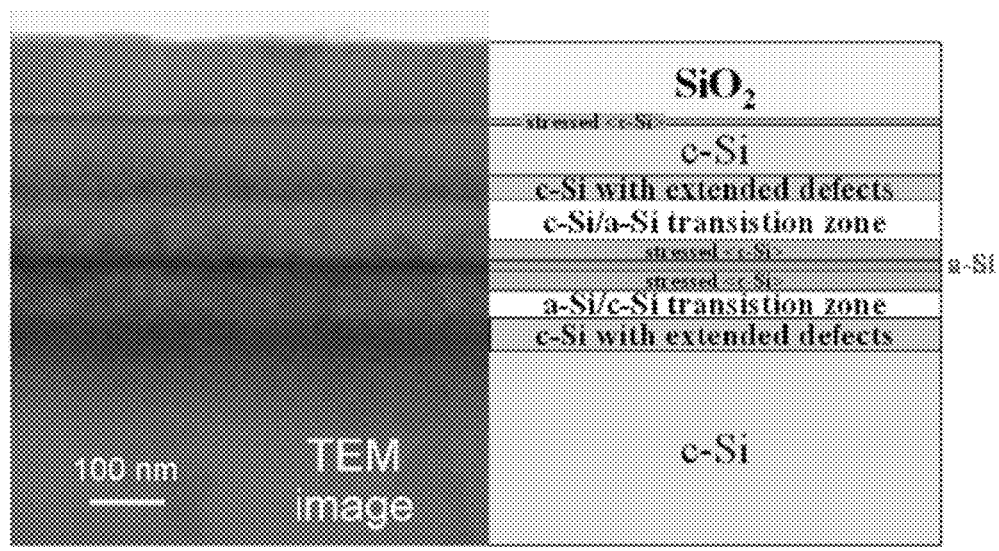
FIG. 3 is a schematic view in cross section TEM image of the planar multi-interface substructure.

FIG. 3 is a schematic view in cross section TEM image of the planar multi-interface substructure realized by controlled recrystallization of the amorphized phase, buried by ion-implantation and post-implantation processing within a crystalline Si; details are explained in the right graph illustrating 2D nanoscale sub-structure.

Figure 4:
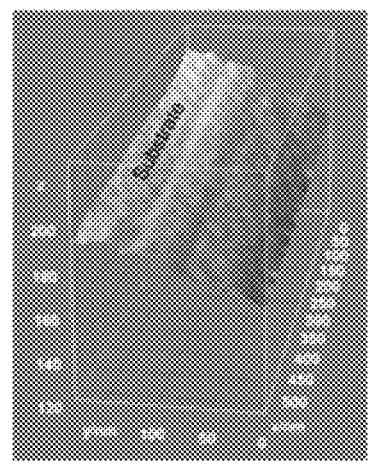
FIG. 4 is 3D BSE (Backscattered Electron Microscopy) image of the buried substructure showing three different Si phases: crystalline, amorphized and metamaterial.

FIG. 4 is an image: 3D BSE (Backscattered Electron Microscopy) image of the buried substructure showing three different Si phases: crystalline, amorphized and metamaterial.

Figure 5:
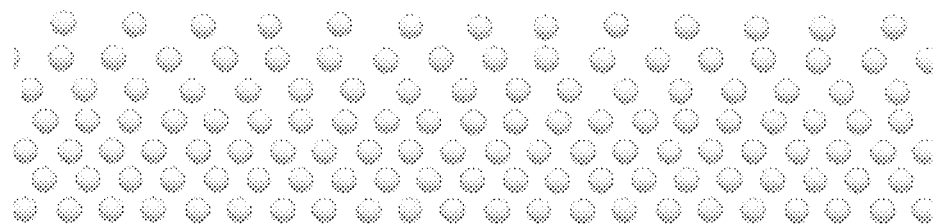
FIG. 5 is a general schematic view of a monolayer superlattice of an example of the ordered superlattice of segtons in their closest environment.

FIG. 5 is a general schematic view of a monolayer superlattice of an example of the ordered superlattice of segtons with their closest environment i.e., suitable and dense distribution of segtons resulting from structural defects conditioned by physical fields and forming the seg-matter nanolayer.

Figure 6:
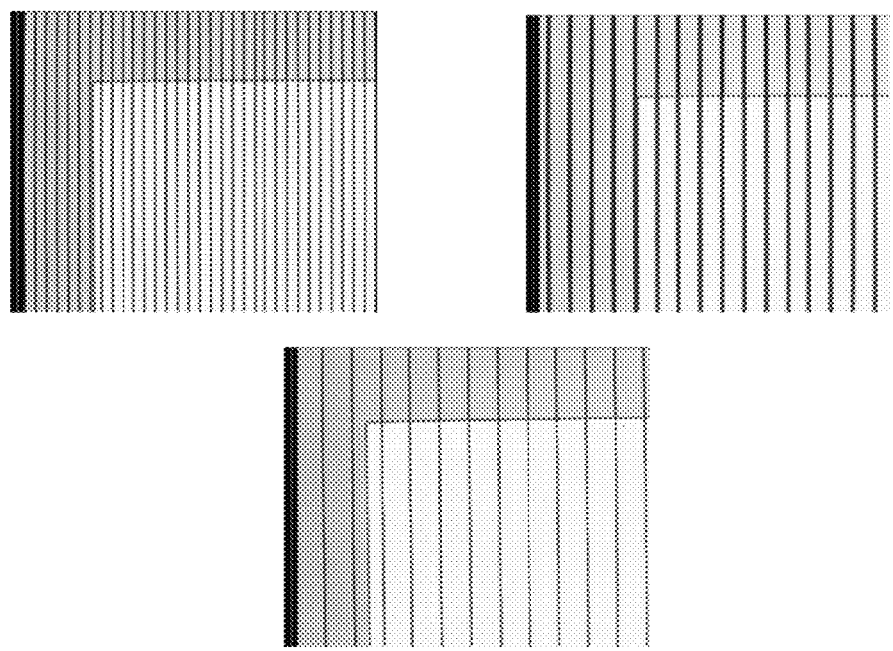
FIG. 6 shows schematic representations of examples of buried discontinuous amorphizations.

FIG. 6 is a schematic representation of examples of buried discontinuous amorphizations; motives realized across an implantation mask by optical microscopy. The remaining crystalline structure appears as the dark line of the width varying between 2 and 10 μm from one image to another. The border band of different gray intensity at right upper corners represents the $SiO_2$, frame layer used at this stage of processing.

Figure 7:
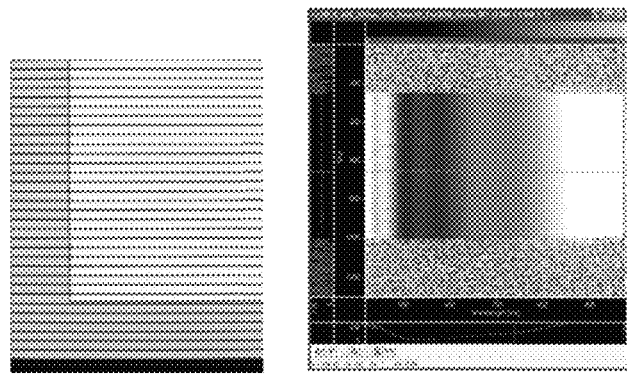
FIG. 7 is a representation which shows a comparison of the optical microscopy of an implantation through a mask with the FIB (Focused Ion Beam) microscopy of a test device showing directly a buried discontinuous substructure.

FIG. 7 is a representation which shows a comparison of the optical microscopy of an implantation through a mask with the FIB (Focused Ion Beam) microscopy of a test device showing directly a buried discontinuous substructure.

Figure 8:
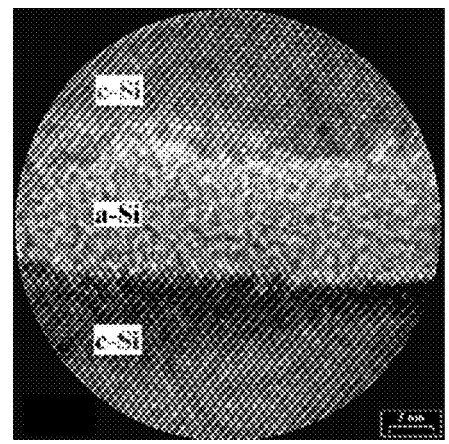
FIG. 8 is a X-TEM image of an example of a buried amorphized nanostructure after a relatively long thermal treatment.

FIG. 8 is a X-TEM image of an example of a buried amorphized nanostructure after a relatively long thermal treatment, a-Si total thickness is of about 5 nm. The good crystallinity in the recrystallised zones is well visible.

FIGS. 9 and 10 are two X-TEM images of two different geometries of amorphized nanostructures buried within the crystalline Si. FIG. 9 is an image with discontinuous amorphization and FIG. 10 an image with amorphized layer with local circular valley system.

FIG. 11 is a schematic representation of an example of a nanomembrane system. The thickness of the seg-matter <c-Si> nanolayer is determined on the crystalline side by the built-in strain coming from a local mechanical field from a dilatation induced by or resulting from the recrystallization cycle by solid phase epitaxy. Drawing not to scale.

FIG. 12 is a cross sectional view of possible insertion places of the seg-matter nanolayers.

FIG. 13 is a multigraph image for the comparison of stair-like theoretical orders of electron multiplication determined on the basis of three mechanisms:
i) impact ionization of the silicon lattice,
ii) exciton multiplicity with the specific energy corresponding to the silicon band gap and
iii) low-energy impact ionization due to segtons.

FIG. 14 is a multigraph image for the comparison of the photovoltaic impact of the seg-matter (experimental carrier generation yield, diamonds) with corresponding effects in bulk silicon and with values of quantum yield for nanocrystals with smooth and rough interfaces [D. Timmerman, J. Valenta, K. Dohnalova, W. D. A. M. de Boer, T. Gregorkiewicz, "Step-like enhancement of luminescence quantum yield of silicon nanocrystals, Nature Nanotechnology 6, 710-713 (2011)].

FIG. 15 is a curve which illustrates the additional current from photon energy.

FIG. 16A is an organigram of the different steps of a process to create seg-matter nanolayers positioned within the light-to-electricity converter according to this invention; and FIG. 16B is a continuation of FIG. 16A.

12. DETAILED EXAMPLE

A detailed example is hereunder described with the help of FIG. 12 according to the following steps.

Pre-treatment of a Si wafer with the preferential (100) crystalline orientation and moderate p-type doping (bore)

First operations at the rear face of the converter—additional p-type doping forming a BSF Operations at the front face of the converter:
　conditioning before implantation sequence: etching and masking
　n-type doping by diffusion from a surface doping source to create an emitter and a photogenerator internal membrane such a PN junction, impurity doping density between $10^{18}$ to $10^{21}$ atoms $cm^{-3}$ Formation of segtons:
　buried amorphization through implantation masks with P ions using pre-determined implantation energy and dose, for example from the range between 50 to 100 keV and of about $5\times10^{14}$ ions $cm^{-3}$,
　thermal treatment cycle shaping uniformed segtons and placing-ordering them in the same conditions within the stressed nanolayer Shaping of segtons and grouping them in a nanolayer, called seg-matter: shaping of the buried amorphization with its wrapping <c-Si> nanolayers stuffed with segtons to obtain a new Si phase that represents a metamaterial called seg-matter during a solid state epitaxy annealing cycle with temperatures varying between near room temperatures and 500° C.

Segton and sag-matter conditioning by specific annealing at 400-500° C. during 5-30 min leading to a good, near uniform distribution of segtons, total activation of segtons, permanent doubly negative electric charge-state, advantageous exposition of the sag-matter to the incident photons Final converter operations: electronic passivation, metallization and light trapping.

The invention claimed is:
1. A method for forming and conditioning an elementary superlattice structure within an all-silicon light-to-electricity converter, comprising a crystalline silicon emitter mass delimited by a PN junction and a front exposure face operatively associated therewith, so as to achieve enhanced light-to-electricity conversion properties when said elementary superlattice structure, disposed within said silicon crystalline emitter mass, is illuminated with solar light illumination, the method comprising:

(1) providing the crystalline silicon emitter mass comprising a heavily n-doped crystalline silicon (c-Si) emitter mass comprising elementary crystalline silicon units (ECSUs), with a density doping between $10^{18}$ and $10^{21}$ atom cm$^{-3}$ up from said PN junction to said front exposure face of said converter, wherein said elementary crystalline silicon units (ECSUs) comprise a multiplicity of silicon atoms, and said heavily n-doped crystalline silicon (c-Si) emitter mass defines a part of a semi-conductor wafer,
wherein said heavily n-doped crystalline silicon (c-Si) emitter mass comprises at least one buried amorphized silicon (a-Si) insertion formed at a predetermined depth within said crystalline silicon (c-Si) emitter mass, between upper and lower portions of said heavily n-doped crystalline Silicon (c-Si) emitter mass;
(2) performing a first annealing by subjecting said amorphized silicon (a-Si) insertion and said heavily n-doped crystalline silicon (c-Si) emitter mass to annealing temperatures within a range of approximately 500 to approximately 550° C. in order to create dilatation forces and a built-in electric field between said amorphized silicon (a-Si) insertion and said upper and lower portions of said heavily n-doped crystalline silicon (c-Si) emitter mass,
so that, on each side of said amorphized silicon insertion (a-Si), a strained crystalline silicon nanolayer (<c-Si), defined as an upper strained crystalline silicon (<c-Si>) transition wrapping nanolayer and a lower strained crystalline silicon (<c-Si>) transition wrapping nanolayer, respectively, is formed, wherein each of the upper and lower strained crystalline silicon (<c-Si>) transition wrapping nanolayers is delimited by a respective pair of nanomembranes, the respective pair of nanomembranes comprising a heterointerface crystalline silicon/amorphized silicon (<c-Si>/a-Si) nanomembrane and a heterointerface strained crystalline silicon/crystalline silicon (<c-Si>/c-Si>) nanomembrane to cover or wrap around the respective elementary crystalline silicon units (ECSUs) in each respective strained crystalline silicon (<c-Si>) transition wrapping nanolayer,
so that a crystalline phase of said strained crystalline silicon (<c-Si>) transition wrapping nanolayers is reordered and said elementary crystalline silicon units (ECSUs) are settled and trapped within said strained crystalline silicon (<c-Si>) transition wrapping nanolayers, wherein said elementary crystalline silicon units (ECSUs) disposed within said upper and lower strained crystalline silicon (<c-Si>) transition wrapping nanolayers are subjected to tensile forces resulting from said dilatation forces, said built-in electric field, and said n-type doping, so as to transform said elementary crystalline silicon units (ECSUs) into elementary nanoscale units called SEGTONS and distributing said SEGTONS throughout said upper and lower strained crystalline silicon (<c-Si>) transition wrapping nanolayers, thereby forming the uniformized, silicon-modified elementary superlattice structure of a metamaterial called SEG-MATTER nanolayer; and
(3) performing a second annealing by subjecting said SEGTONS to annealing temperatures in a range of from approximately 350° C. to approximately 450° C. so as to provide said SEGTONS with a permanent double negative charge state;
wherein said SEGTONS are configured so that absorption of light illumination generates warm/hot electrons which exhibit high kinetic energy and which collide and interact with said SEGTONS, thereby effectively generating additional electron populations, so as to achieve enhanced light-to-electricity conversion properties.

2. The method according to claim 1, comprising:
before the first annealing, implanting ions through an implantation mask to form the at least one buried amorphized silicon (a-Si) insertion at the predetermined depth within said crystalline silicon (c-Si) emitter mass.

3. The method according to claim 2, wherein:
the ion implanting is performed said heavily n-doped crystalline silicon (c-Si) emitter mass close to said front face at a dose of $5 \times 10^{14}$ ions cm$^{-3}$.

4. The method according to claim 1, wherein:
each of said nanomembranes has a thickness in a range of 3 to 10 nm.

5. The method according to claim 1, wherein:
said metamaterial called SEG-MATTER is organized from building blocks which are ordered within the elementary superlattice structure as a network, due to said built-in electric field that is induced by said dilatation forces at heterointerface crystalline-silicon/amorphized silicon (c-Si/a-Si) transition zones said delimiting said metamaterial called SEG-MATTER,
said elementary nanoscale units called SEGTONS forming at least one nanolayer or two superposed nanolayers so as to be close to an absorption zone of energetic photons.

6. The method according to claim 1, wherein:
heterointerface crystalline-silicon/amorphized silicon (c-Si/a-Si) transition zones delimiting said metamaterial called SEG-MATTER comprises divacancies having a density of about $10^{20}$ cm$^{-3}$.

7. The method according to claim 1, further comprising:
unidirectionally extracting secondary electrons, after their collisional generation outside of said metamaterial called SEG-MATTER via a conduction band, achieved by their injection into said emitter mass so as to avoid recapture of kicked out equilibrium electrons by maintaining their inability to return to their starting points by electric screening,
wherein said localized electron injection and extraction is performed across each of said nanomembranes delimiting each of said strained crystalline silicon (<c-Si>) wrapping nanolayers, in accordance with specific electron conduction through a nanoscale system.

8. The method according to claim 1, wherein:
heterointerface crystalline-silicon/amorphized silicon (c-Si/a-Si) transition zones delimiting said metamaterial called SEG-MATTER comprise divacancies which are trapped by said dilatation forces within said strained crystalline silicon (<c-Si>) wrapping nanolayers.

9. The method according to claim 1, wherein:
said strained crystalline silicon (<c-Si>) transition wrapping nanolayers are homogenized.

10. The method according to claim 1, further comprising:
performing heavy n-type doping of said silicon crystalline emitter mass (c-Si) by low-temperature thermal diffusion at T<1000° C.;
pre-conditioning a surface portion of said wafer after said diffusion process so as to allow proper control of said implanted ions;

using 10-200 keV ion beam irradiation leading to said buried amorphization of said amorphized silicon (a-Si) insertion within said crystalline silicon (c-Si) emitter mass; and performing final processing of said wafer by AR coating, electronic passivation, and metallization.

11. The method according to claim 1, wherein:

said at least one buried amorphized silicon (a-Si) insertion within said crystalline silicon (c-Si) emitter mass is achieved by using ion beam irradiation.

12. The method according to claim 1, wherein:

said forming and conditioning of the elementary superlattice structure within said all-silicon light-to-electricity converter allows the creation of a predetermined set of electron energy levels that is useful in the low-energy generation of secondary electrons adapted to the solar spectrum.

* * * * *